United States Patent [19]
Meadows

[11] Patent Number: 5,934,865
[45] Date of Patent: Aug. 10, 1999

[54] DISK GRIPPER

[75] Inventor: John W. Meadows, Mountain View, Calif.

[73] Assignee: Trace Digital LLC, San Jose, Calif.

[21] Appl. No.: 08/977,780

[22] Filed: Nov. 25, 1997

[51] Int. Cl.$^6$ .............................. B65H 3/00; B65G 59/02
[52] U.S. Cl. ...................... 414/796.9; 414/729; 414/751; 414/908; 414/937; 414/941; 414/800; 294/93
[58] Field of Search ................. 414/796.9, 729, 414/744.8, 751, 908, 937, 941, 800; 901/16, 38, 31; 294/93, 94

[56] References Cited

U.S. PATENT DOCUMENTS

| | | | |
|---|---|---|---|
| 4,604,024 | 8/1986 | Edwards et al. | 414/908 |
| 5,000,651 | 3/1991 | Akagawa et al. | 414/741 |
| 5,158,331 | 10/1992 | Wesselski et al. | 294/94 |
| 5,195,794 | 3/1993 | Hummel, Jr. et al. | 294/94 |
| 5,421,630 | 6/1995 | Sergi et al. | 294/93 |
| 5,468,111 | 11/1995 | Flint et al. | 414/416 |
| 5,480,108 | 1/1996 | Amiand et al. | 294/93 |
| 5,542,526 | 8/1996 | Wurgler | 294/93 |
| 5,692,878 | 12/1997 | Freund | 414/796.9 |
| 5,713,618 | 2/1998 | Kocsis | 294/93 |
| 5,718,559 | 2/1998 | Freund | 414/908 |

FOREIGN PATENT DOCUMENTS

| | | | |
|---|---|---|---|
| 1-104532 | 4/1989 | Japan | 414/908 |
| 3-272156 | 12/1991 | Japan | 414/941 |

*Primary Examiner*—Janice L. Krizek
*Assistant Examiner*—Douglas Hess
*Attorney, Agent, or Firm*—Thomas Schneck; John P. McGuire, Jr.

[57] ABSTRACT

A disk gripper featuring a spindle fitting through the central hole of a disk, with the spindle harboring a movable latch which is a pin carried by a movable arm. An actuator shifts the latch out of the spindle once the spindle has entered a disk hole with the latch causing the disk to slide laterally into a curled finger which provides a protective, non-contacting envelope. The disk is held in place on the shoulder of a bulbous portion of the spindle which keeps the disk on the shoulder of the spindle. The actuator is activated by a floating sensor ring carried by the spindle. When the spindle passes through a disk hole, the sensor ring moves upwardly, resting on the disk sending an upright tripper into an optical detector causing the latch to retract and allowing the spindle to pass into the disk hole. After passage into the disk hole the latch is released, causing lateral disk motion, causing the disk to laterally slide into a securely held position.

20 Claims, 4 Drawing Sheets

*Fig.* 5
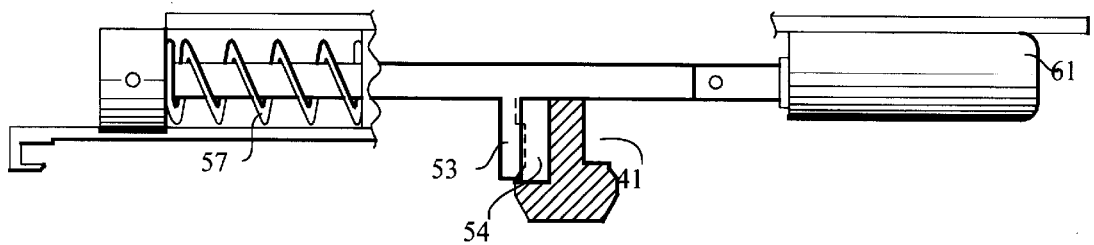
*Fig.* 6
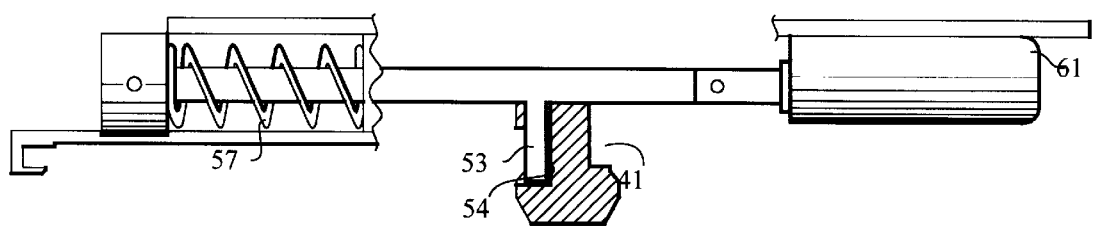
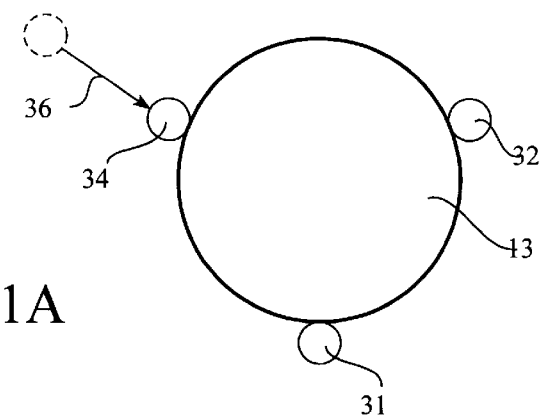
*Fig.* 1A

DISK GRIPPER

TECHNICAL FIELD

The invention relates to a robotic apparatus and, in particular, to a gripper to be used with a robotic arm for picking disks.

BACKGROUND ART

Most automated disk transfer mechanisms use a vacuum puck to assist in holding a disk. Such vacuum apparatus requires a pump which is frequently noisy and poses a risk of introducing particulate matter into the ambient environment. Moreover, vacuum pumps produce local vibration which must be damped.

Some non-vacuum disk pickers are known. For example, U.S. Pat. No. 5,000,651 shows a disk gripper which allows a pair of disk-gripping members to enter the central hole of the disk and then spread apart, holding a disk by outward pressure on a rim of a central hole and at the release of the disk, the disk holding members are pulled together, allowing the rim of the disk to slip over the compressed members. The entire apparatus is associated with a robot arm so that disks may be moved from one place to another once a disk is held securely in place.

Another automatic disk holder apparatus is shown in U.S. Pat. No. 5,468,111. In this case, disks are manipulated by edge contact in combination with contact with the center hole, as shown in FIG. 7 of the patent. Such edge and hole contact provides positive gripping for transport.

What is needed is a simpler, low cost system for moving disks, such as from a stack of disks to another location for reading, writing, copying, polishing, formatting, or other purposes.

SUMMARY OF INVENTION

The above object has been achieved with a gripper for picking disks of the type having a central hole. The gripper of the present invention relies on an irregularly shaped spindle to hold disks on a spindle shoulder after a disk is slid laterally onto the shoulder. The lateral sliding motion of the disk is forced by a latch which is usually partially or totally retracted within the spindle when the spindle passes through the disk hole, but is thrust outwardly once the spindle is inside of the disk hole. An electrical actuator moves the latch on a signal from a detector which senses the motion of the spindle into the disk hole by means of an annular sensor ring. This sensor ring is associated with the spindle. The annular sensor ring floats below the bulbous portion of the spindle, carried or lifted by a disk being approached by the gripper. The sensor ring is axially movable relative to the spindle such that a portion of the annular sensor ring trips the optical detector as the spindle enters the disk hole. This brings about a thrusting of the latch outwardly. An extended portion of a cross beam of the gripper includes a curled finger which shields the radially outward edge of the disk in a non-contacting manner after the disk has been laterally shifted. To release a disk, the actuator is momentarily turned on, pulling the latch inwardly, allowing a disk to fall off the shoulder of the spindle under gravitational force and the annular ring atop the disk.

BRIEF DESCRIPTION OF THE DRAWINGS

FIG. 1A is a plan view for a three post disk stacker for use with the apparatus of FIG. 1.

FIGS. 5 and 6 are simplified operational views corresponding to FIGS. 2 and 3, respectively.

BEST MODE OF CARRYING OUT THE INVENTION

Figure 1:
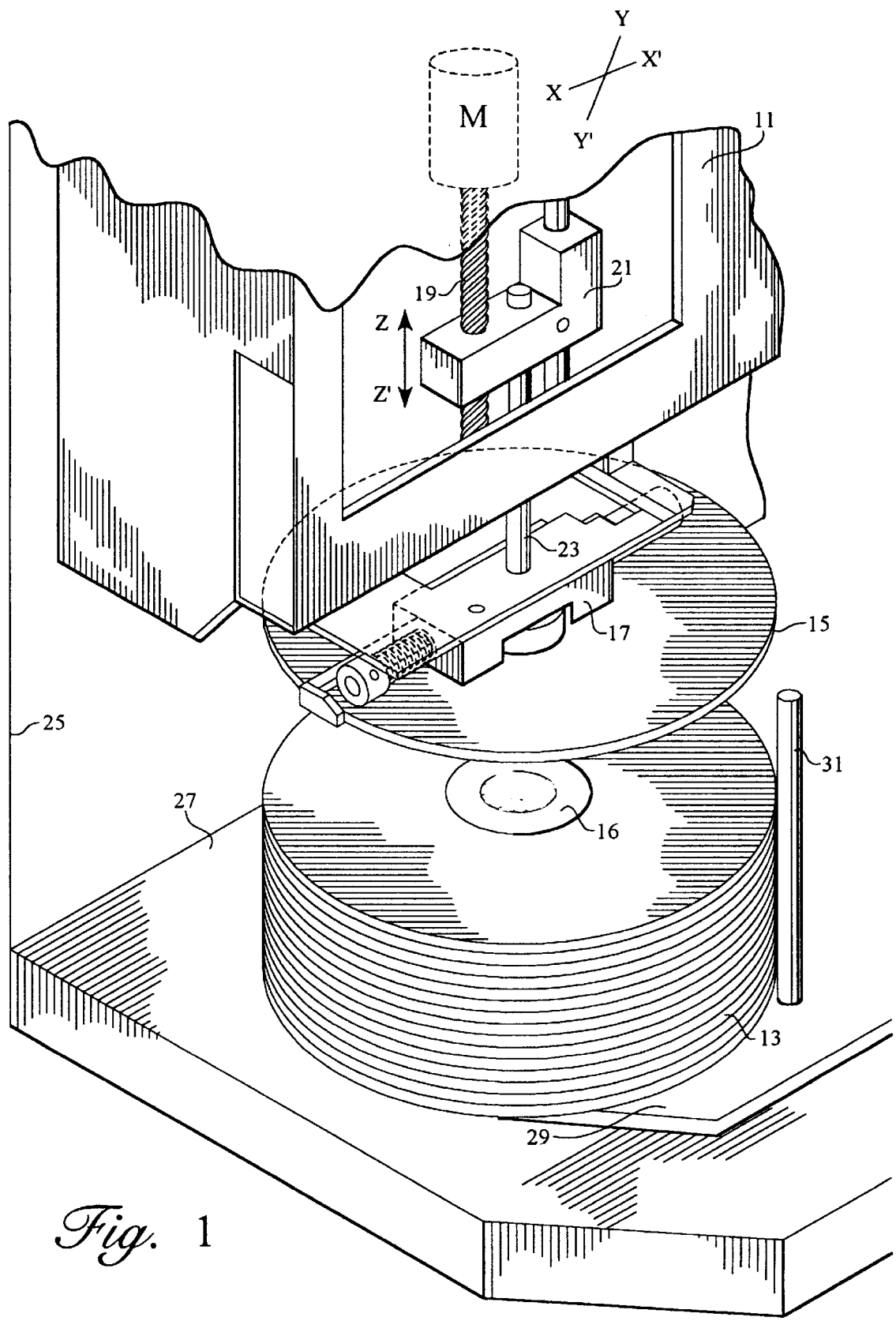
FIG. 1 is a perspective view of a robotic apparatus for picking disks, including the gripper of the present invention.

With reference to FIG. 1, a robotic arm 11 is capable of lateral motion in X and Y directions, as indicated by the arrows X-X' and Y-Y', under the control of motors, not shown. The arm 11 is also capable of up and down motion in the Z direction, indicated by the arrow Z-Z' under the control of a motor, M, which may be a stepper or servo motor. The motor turns screw 19 on which an arm fixture 21 rides. The fixture is supported on an upright post 23 which allows the arm fixture 21 to slide thereon as it is driven by screw 19. The arm fixture 21 carries disk gripper 17 which is capable of picking a disk 15 from a stack of disks 13, held in place by means of a stacking post or guide 31. In FIG. 1A a three post stacking arrangement is shown. Posts 30 and 32 are fixed, but post 34 is attached to a door of a cabinet and swung into place along arc 36 as an enclosure door is closed. The disks are moved into position using a hopper 29, supported on a floor plate 27 within an enclosure 25. The entire enclosure may be in a cabinet or in a vacuum environment, depending upon the application. The disks are of the type having a central hole 16 such as recordable optical disks, known as CDRs, or digital versatile disks, known as DVDs.

The present invention may be used to rapidly pick such a disk off of a stack, move it to a disk reading or writing station for information transfer and then move the disk again to another stack of finished disks. In this manner, disks may be duplicated, written or read, polished, sorted or otherwise automatically moved under robotic control by means of a computer or controller.

Figure 2:
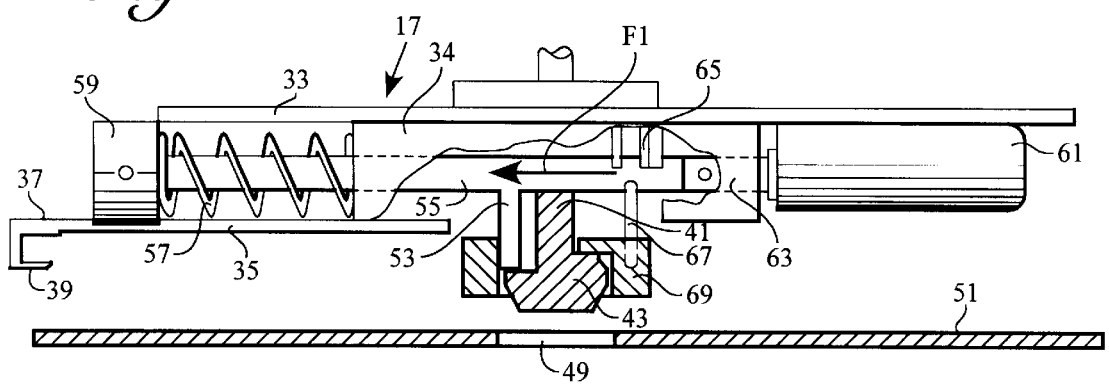
FIGS. 2–4 are side sectional, operational views of the disk gripper shown in FIG. 1.

In FIG. 2, the disk gripper 17 may be seen to comprise a cross beam 33 which is linked to a body 34 carrying an extended portion 35, more clearly seen in FIG. 7 discussed below. The cross beam need not be any particular type of beam, but may be any cross member capable of supporting an extended portion near the edge of a disk. Returning to FIG. 2, the extended portion includes a curled finger 37 such that the extended portion extends beyond the rim of a disk 51 to be picked. The curled finger 37 has an inward extremity 39 defining a notch or shelf sufficiently wide to either envelop or provide a ledge for shielding the outside edge of disk 51 from abrasion. The body 34 houses a spring 57 which is coiled about an arm 55 terminating in a spring housing 59 into which the arm is slidably movable. The opposite end of the arm is connected to actuator arm 63 which, in turn, is connected to an electrical actuator 61. Arm 55 also carries a fixed latch 53, which may be a pin, rod, shaft, or other elongated member, extending perpendicularly downwardly, parallel to the axis of a cylindrical spindle 41.

Cylindrical spindle 41 is supported within body 34, free of arm 55, allowing arm 55 to slide transversely past the spindle, without contact. The cylindrical spindle 41 has a bulbous portion 43 at a lower extremity of a size which will fit within the central rimmed hole 49 of disk 51. Spindle 41 has an axial peripheral slot or cutaway section which allows latch 53 to be retracted within spindle 41, or at least sufficiently within so that the latch and spindle can together pass through a disk hole without contact.

Spindle 43 supports an annular sensor ring 69, a ring having substantial thickness, about 8 mm. The annular sensor ring has a stepped diameter which contacts the cylindrical spindle above the bulbous portion 43 for support. The step allows latch 53 to pass, without interference. The annular sensor ring 69 carries an upright pin which is a detector tripper 67 having an upward extremity which will fit in between an optical detector and receiver, forming detector optics 65.

In the lowermost position of the annular sensor 69, as shown in FIG. 2, the detector tripper 67 is well below the detector optics 65. This causes the actuator 61 to be off. When the actuator is off, the main force on the latch 53 is a pulling force provided by a spring 57, the force indicated by the arrow F1, placing the latch outside of the spindle. Note that the annular sensor ring 69 has a sufficiently wide inside diameter to allow the latch 53 to project outwardly from the spindle, without displacing the annular sensor 69.

Figure 3:
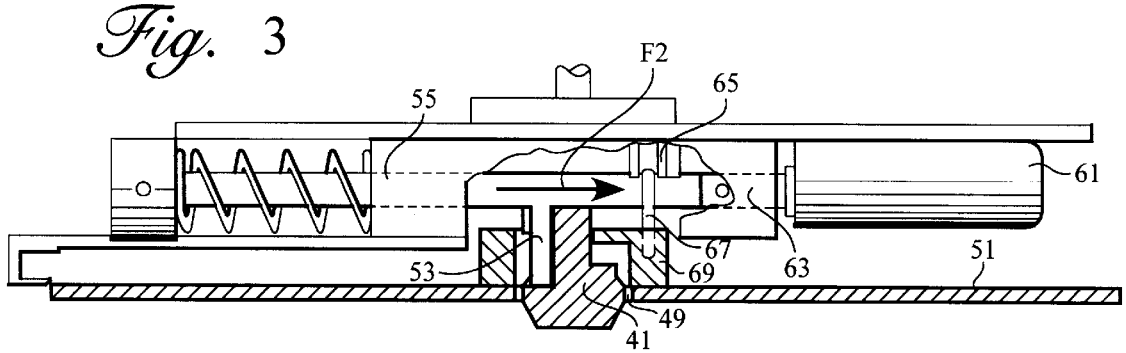

Under command of the robotic arm, the cylindrical spindle 41 is moved toward a disk, as shown in FIG. 3. As the cylindrical spindle 41 passes through the hole 49 in disk 51, the annular sensor ring 69 makes contact with the upper surface of the disk causing the detector tripper 67 to move upwardly into detector optics 65. The sensor ring is moved along the spindle axis, together with the disk. The detector optics 65 consists of one or more pairs of optical sources and detectors. When an optical beam generated by a light source, such as a semiconductor diode, is interrupted, the detector optics 65 sends a signal to actuator 61 causing the actuator to momentarily retract in the direction of the arrow F2. This causes latch 53 to move into a slot or cutaway portion of cylindrical spindle 41. The cylindrical spindle can now pass through the central rimmed hole 41 without interference.

Figure 4:
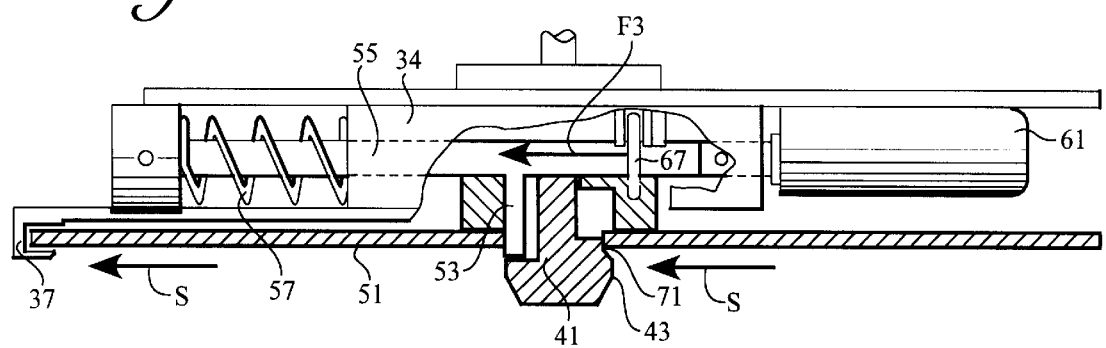

Once the bulbous portion 43 of the cylindrical spindle 41 passes through the central rimmed hole 49 the actuator 61 may be released, as shown in FIG. 4. The release condition may be commanded in several ways. A simple timeout mechanism, e.g. after 0.1 seconds, may allow the actuator 61 to release arm 55. Since the gripper is advanced by motor M whose rate of movement is known, a timeout mechanism is safe. Alternatively, since the detector tripper 67 has moved to a higher position, a second optical source and detector, mounted above the first source and detector can have an interrupted beam which is detected within the detector optics 65. Since the disk has approached body 34 upon entry of the bulbous portion through the hole, the radially outward periphery of the disk is slid into the curled finger 37 by lateral motion of the disk in the direction of arrows S. Note that the curled finger does not contact the disk, but rather envelops the disk in a non-contacting, protective manner. Note also that the length and position of the latch must be such that only one disk is slid laterally. The position of the latch may be established by the state of the electrical actuator 61. Disks on a stack usually have known thickness, facilitating positioning of the latch.

The disk is supported by a shoulder 71 of the bulbous portion 43 of the cylindrical spindle 41. At a radially opposite side of the hole, the latch 53 keeps the disk rim portion supported on shoulder 71 in place, without exerting tension or pressure on the disk rim.

A signal can be sent to the actuator 61 for release. In the release condition, spring 57 is allowed to pull latch 53 outwardly relative to the axis of the cylindrical spindle 41 contacting the rim of the hole in disk 51, exerting a force on the disk in the direction of arrow F3, the direction of motion of latch 53. To release a disk, the command signal to actuator 61 causes the actuator arm 63 to move in a direction shown in FIG. 3. In this situation, the latch is retracted causing a disk to start to fall off the shoulder 71 since no tension exists to keep on the shoulder and gravitational forces urge the disk to fall around the bulbous portion 43. Simultaneously, the annular sensor ring pushes downwardly on the disk further urging it off of the bulbous portion.

FIG. 5 shows a slot 54 in cylindrical spindle 41 in which the latch 53 may reside. In FIG. 5 the cylindrical spring 57 is biasing the latch out of the slot 54 while the actuator 61 remains off. In FIG. 6, the actuator 61 has been turned on and the latch 53 overcomes the force of spring 57 moving into the slot 54 so that the spindle 41 can pass through a central hole of a disk without contacting the disk.

Figure 7:
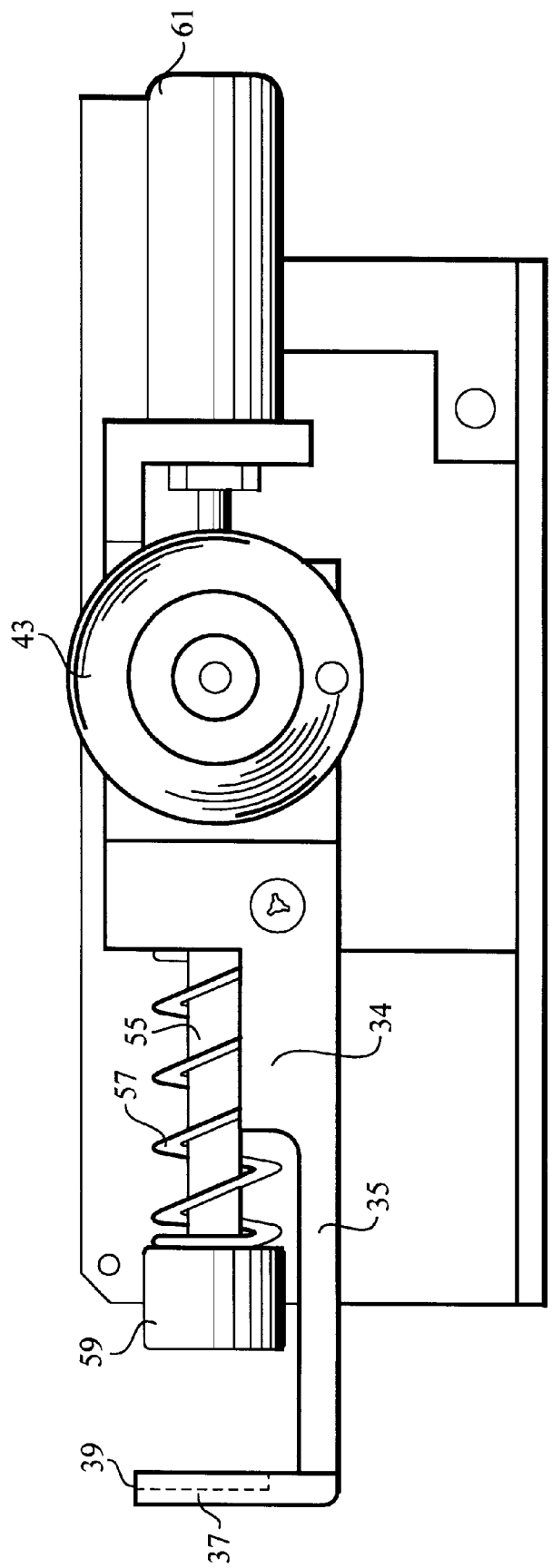
FIG. 7 is a bottom view of the disk gripper illustrated in FIG. 1.

In FIG. 7, the curled finger 37 is seen to be joined to extended portion 35 of body 34. The inwardly curled extremity 39 is actually a lip, serving as a shelf for protecting the edge of a disk. The protective envelopment of a disk may be on two sides or three sides, but in both cases the disk does not contact the curled finger 37 or the extremity 39. Spring 57 has an end fixed within spring housing 59. The housing has a sufficient width to accommodate motion of the arm 55 caused by actuator 61.

The disk gripper of the present invention may be used with various automatic or programmed arms providing X, Y and Z motion.

I claim:

1. A gripper for a robotic apparatus for picking disks of the type having a central hole, the gripper comprising,
    a cross member associated with a robot arm, the member having an extended portion near an outer rim of a disk to be picked,
    a cylindrical spindle having a bulbous end portion with a shoulder capable of fitting within the central hole of a disk, the spindle supported from the cross member and housing a latch movable into and out of a slot within the spindle,
    a detector capable of detecting passage of the bulbous portion through the disk hole, the detector associated with the spindle away from the bulbous portion and generating an electrical signal indicative of such passage,
    an electrical actuator responsive to the signal from the detector and having a movable rod linearly pushing the latch against a rim of the disk hole,
    whereby the electrical actuator urges the latch out of the spindle, thereby shifting the position of the disk, the disk being supported at its hole rim by the shoulder of the bulbous portion and the latch.

2. The gripper of claim 1 further comprising a curled finger at an end of said cross member having dimensions for enveloping a disk edge, said disk being nudged into envelopment by the latch.

3. The gripper of claim 2 wherein said curled finger comprises a shelf which envelops said disk in a non-contacting manner.

4. The gripper of claim 1 further comprising,
    an annular sensor ring supported at the bulbous end of the spindle in a floating manner relative to the spindle, the annular sensor ring carrying a detector tripper capable of activating the detector.

5. The gripper of claim 4 wherein the detector tripper is a pin projecting from the sensor ring.

6. The gripper of claim 1 wherein said detector is an optical detector.

7. The gripper of claim 1 wherein the latch is an elongated member connected to the movable rod of the actuator.

8. The gripper of claim 1 wherein a spring is associated with the latch, biasing the latch out of the spindle from a position seated within said slot.

9. The gripper of claim 8 wherein said spring is mounted in opposition to the actuator.

10. The gripper of claim 1 wherein the cross member is movable by a motor associated with a robotic apparatus.

11. The gripper of claim 10 where said motor drives a screw connected to the cross member.

12. The gripper of claim 1 wherein said actuator is supported by the cross member.

13. A gripper for a robotic arm adapted for picking disks of the type having a central hole, the gripper comprising, an elongated spindle, having an axis, attached to a robotic arm movable both vertically and laterally, the spindle having an exterior slot parallel to the axis and a lower bulbous portion, including a shoulder capable of fitting within the central hole of a disk, a sensor ring associated with the spindle in a vertically movable manner parallel to the spindle axis, the ring having a lower surface adapted for contact with the disk, moving the sensor ring along the spindle axis, the sensor ring having a first position prior to contact with the disk and a second position after contact with the disk and vertical motion of the spindle into the disk hole to the extent that the bulbous portion of the spindle is within the disk hole above the shoulder, a latch supported for lateral movement transverse to the spindle axis to a first position in said slot allowing a disk hole to pass over the latch without contact and to a second position extending from the slot contacting the disk in a manner nudging the disk laterally away from the spindle axis, a fixed finger extending laterally away from the spindle to a curled terminus having a width capable of protectively wrapping a disk edge, a detector associated with the sensor ring and producing a first signal when the sensor ring is in the second position and a second signal when the sensor ring is in the first position, an electrical actuator having a force rod urged to move the latch laterally upon receipt of the first detector signal, whereby the disk is shifted laterally into the curled terminus of the fixed finger by the actuator, the disk residing in the curled terminus in a non-contacting manner, the disk being supported by the shoulder of the bulbous region.

14. The gripper of claim 13 further defined by a spring biased in opposition to the force rod.

15. A method of picking a disk with a rimmed hole comprising, inserting a spindle with non-uniform peripheral regions through the rimmed hole of a disk, sensing passage of the spindle through the rimmed hole, projecting a latch radially outwardly from the spindle, shifting the disk position laterally by contacting the rimmed hole with the latch, holding the shifted disk at rest against a non-uniform peripheral region of the spindle with the latch, and applying motion to the spindle, transverse to the shifted disk position, thereby picking the disk.

16. The method of claim 15 further defined by supporting the spindle from a robotic apparatus.

17. The method of claim 15 further defined by enveloping radially outward edges of the disk with a curled finger.

18. The method of claim 17 wherein said envelopment is non-contacting.

19. The method of claim 17 further defined by supporting the curled finger in a fixed position relative to the spindle.

20. The method of claim 15 further defined by generating an electrical signal in response to sensing passage of the spindle through the rimmed hole.

* * * * *